United States Patent [19]
Röser

[11] Patent Number: 5,631,489
[45] Date of Patent: May 20, 1997

[54] OPTOELECTRONIC DEVICE

[75] Inventor: Hans P. Röser, Bonn, Germany

[73] Assignee: Max-Planck-Gesellschaft Zur., Munich, Germany

[21] Appl. No.: 388,726

[22] Filed: Feb. 15, 1995

[30] Foreign Application Priority Data

Sep. 13, 1994 [DE] Germany ............... 94 14 895.3

[51] Int. Cl.$^6$ ................................ H01L 31/00
[52] U.S. Cl. .................. 257/449; 257/431; 257/459; 257/464; 250/338.4
[58] Field of Search ................. 257/449, 464, 257/431, 459; 250/338.4

[56] References Cited

U.S. PATENT DOCUMENTS 5,332,918  7/1994  Smith et al. .............. 257/431

OTHER PUBLICATIONS

H.P. Röser et al., "Nanostructure GaAs Schottky Diodes For Far–Infrared heterodyne Receivers", Infrared Phys. Technol. vol. 35, No. 2/3, pp. 451–462, 1994 no month.

H.P. Roeser et al., "Current–frequency Characteristics of Submicrometer GaAs Schottky Barrier Diodes With Femtofarad Capacitance", J. Appl. Phys. 72(7), 1 Oct. 1992, pp. 3194–3197.

Primary Examiner—Jerome Jackson, Jr.
Assistant Examiner—Nathan K. Kelley
Attorney, Agent, or Firm—Wolf, Greenfield & Sacks, P.C.

[57] ABSTRACT

An optoelectronic device based on a conduction constriction through which charge carriers pass ballistically. The constriction has a cross-sectional area of 2 square microns or less and a thickness D and is made of doped semiconductor material with a carrier mobility $\mu$. The thickness D is selected to be near to a characteristic path length $D_{mes}$ defined by $D^2_{mes}=(h/2e)*\mu$ where h is Planck's constant and e the elementary charge. The device can be used as a heterodyne radiation detector for detecting radiation in the frequency range between 3 GHz and 3 THz and is capable of detecting signals with a power of less than $10^{-14}$ watts in room temperature operation. The device can also be operated as the front end of a spectrometer. Other applications of the device include use as a high frequency AC current source or oscillator for microelectronics, for instance in the 100 to 500 GHz range.

35 Claims, 8 Drawing Sheets

Table

|  | Prior Art | | | Invention | |
|---|---|---|---|---|---|
|  | J118 | 1I7 | 1I12 | 1T14 | 1T15 |
| Anode Diameter d[μm], A=(π/4)d² | 1.0 | 0.8 | 0.45 | 0.5 | 0.25 |
| Thickness of the Epitaxial Layer D[Å] | 1000 | 1000 | 600 | 300 | 300 |
| Doping Density of the Epitaxial Layer $N_d \times 10^{17}$ [cm⁻³] | 1.0 | 3.0 | 4.5 | 10 | 10 |
| Capacitance at zero Bias Voltage $C_j$ [fF] | 1.8 | 0.9 | 0.45 | 0.8-0.9 | 0.25 |
| Series Resistance $R_s$ [Ω] | 30 | 13 | 33 | 8-12 | ≈20 |
| Depth of the depletion zone during operation : $D_{depl}$ [Å] (a) edge effects neglected | 350 | 300 | 310 | 250 | 265 |
| (b) edge effects included | 320 | 270 | 260 | 208 | 208 |
| No. of electrons clocked through the Scottky contact per cycle, $N_e$ [-] | 2800 | 4500 | 2200 | 4900 | 1300 |
| Mobility of the electrons in the epitaxial layer at 300K μ [cm²V⁻¹s⁻¹] | 4900 | 3600 | 3200 | 2100 | 2100 |
| Critical Frequency $v_{co}$ [THz] | 5.3 | 7.4 | 8.0 | -- | 12.5 |
| Cut-Off Frequency $v_a$ [GHz] | 10.9 | 21.8 | 43.5 | -- | 77.4 |

FIG. 3

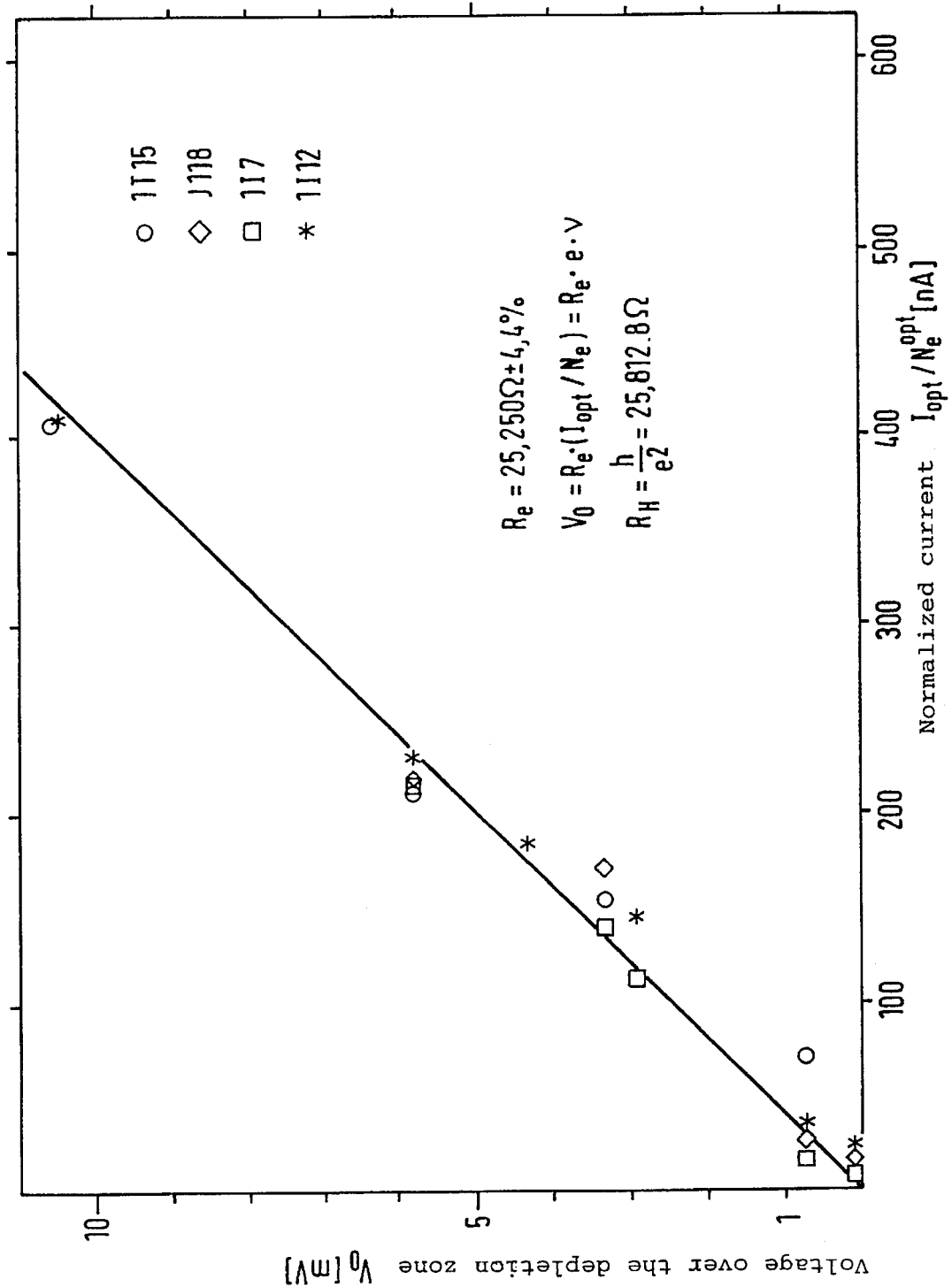

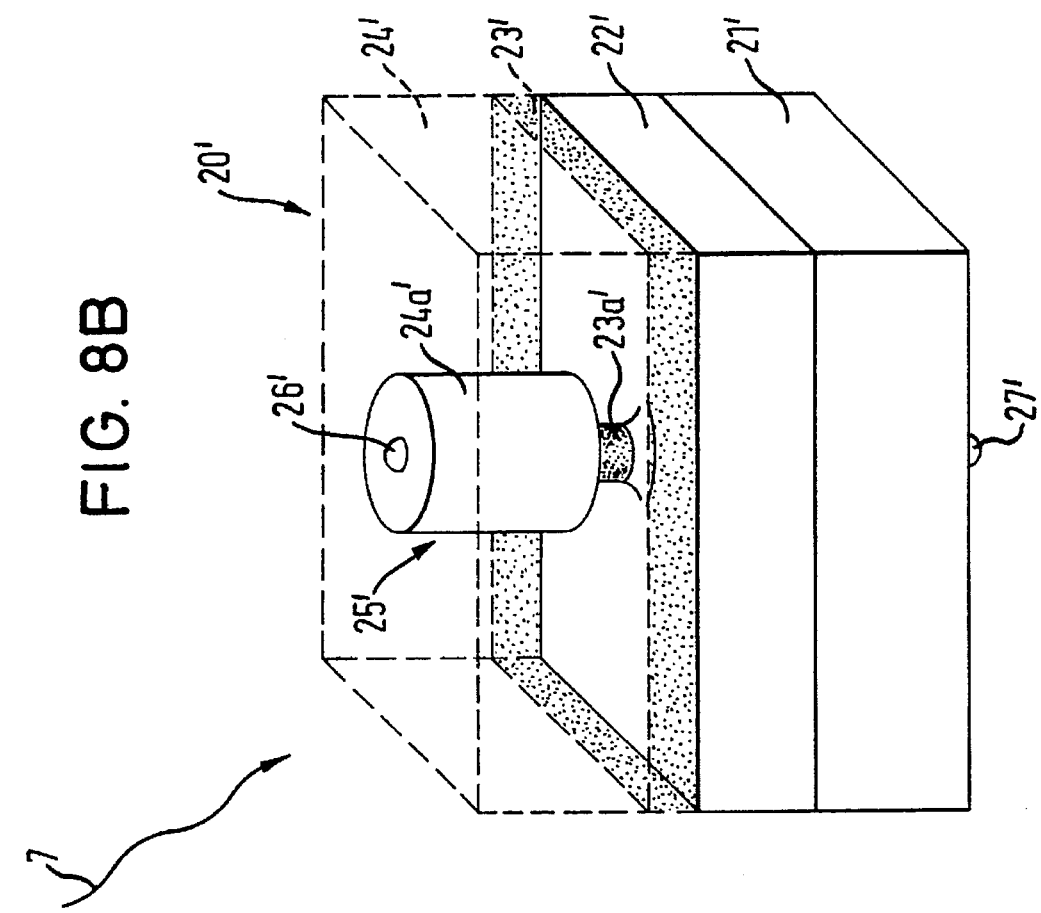
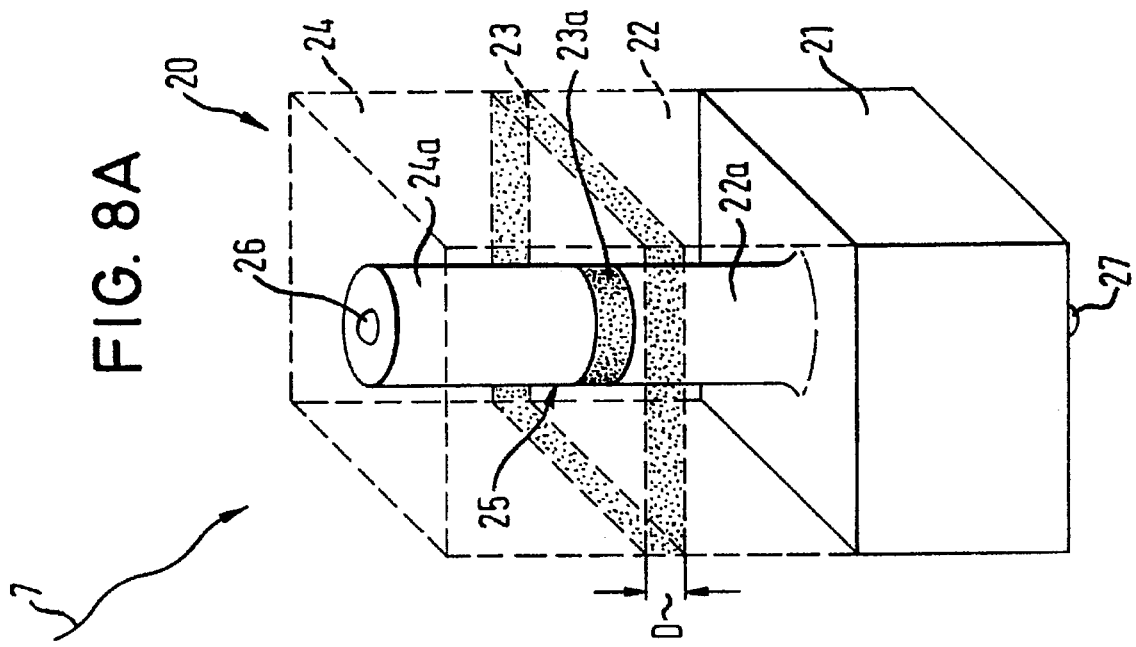

OPTOELECTRONIC DEVICE

FIELD OF THE INVENTION

The invention relates to an optoelectronic device and further relates to the use of an optoelectronic device as a heterodyne radiation detector as well as an optoelectronic converter, in particular for operation in the frequency range between 3 and 3000 GHz. The invention relates furthermore to a spectrometric system containing an optoelectronic device of this kind.

BACKGROUND OF THE INVENTION

A generic optoelectronic device is known from H. P. Röser, R. U. Titz, G. W. Schwaab and M. F. Kimmit, Journal of Applied Physics, vol. 72, pages 3194 to 3297 (1992) which has the form of a point diode and is used as a heterodyne radiation detector. For this purpose, this diode comprises an antenna for coupling in a signal to be measured, wherein the antenna is in connection with the doped semiconductor layer via the formation of a Schottky point contact with a cross-sectional area A. This Schottky diode is used as a mixer and has the function of transforming a signal of frequency $v_{sig}$ to be measured to a substantially lower intermediate frequency or difference frequency $v_{IF} = |v_{sig} - v_{LO}|$ by means of a reference radiation source of frequency $v_{LO}$ which serves as a local oscillator (LO). The resulting signal can then be amplified by means of conventional amplifiers and, if desired, spectrally analysed by conventional spectrometric systems.

A coherent microwave source or an optically pumped gas laser have been used as the reference radiation source.

Spectrometric systems comprising a radiation detector as described in the cited publication have been successfully employed as telescopes for approximately 10 years, both in ground stations and in aeroplanes.

It is known from the cited publication (JAP, 72, 3194 (1992)) that for a heterodyne detector for which the current constriction is realised by means of a Schottky point contact, the electrons flow through this conduction constriction ballistically and in packets when the Schottky diode which is operating as a detector is illuminated by the reference radiation source.

Ballistic transport occurs even at room temperature, since the electrons do not suffer from any inelastic scattering processes as they flow through the conduction constriction. Consequently, the electrons remain in phase with the incoming radiation of the reference radiation source as they pass through the conduction restriction.

Packet-wise transport of the electrons means that in each period of the reference source a particular number of electrons $N_e$ pass through the conduction constriction, i.e. through the Schottky contact region. The number $N_e$ of electrons per packet is independent of the frequency of the reference source. Therefore, with a measurement current I flowing through the diode the following equations holds $$I = (N_e e) v_{LO} \tag{1}$$

e being the electron charge.

Up until now it was assumed that the diode in the region of the Schottky contact functioned in the manner of a capacitor which, in each period of the radiation originating from the reference source, was charged with a particular number $N_e$ of electrons and discharged once again. The depth $D_{depl}$ of the depletion zone which arises due to this charging and discharging process in the doped semiconductor layer bounding the Schottky contact is then given by $$D_{depl} = N_e/(N_d * A) \tag{2}$$

with $N_d$ being the doping density of the doped semiconductor layer (epitaxial layer).

The ultimate sensitivity of detection achievable with a diode of this kind is of central importance and this ultimate detection sensitivity primarily depends on the noise produced in the diode itself.

It is experimentally established that maximum sensitivity (i.e. minimum noise) in the diodes studied is achieved at a particular current $I^{Opt}$, the value of which being different from diode to diode. When a diode is driven at its "optimum" current $I^{Opt}$ then according to equation (1) a particular "optimum" number of electrons $N_e^{Opt}$ per cycle flows through the Schottky contact. In the optimized case equation (1) thus becomes $$I^{Opt} = (N_e^{Opt} e) v_{LO}$$

In the prior art it was unclear why the maximum sensitivity of the detector occurred for a particular "optimum" number of transmitted electrons per period.

Correspondingly, the origin of the occurrence of an optimum measurement current flow was not understood and the values for this optimum measurement current flow could not be predicted in advance.

The fact that the depletion depths $D_{depl}$ calculated from equation (2) for various detectors which had different optimum current strengths were always substantially the same could also not be explained.

Alongside the selection of the measurement current, the intrinsic noise of the detector is also influenced by the selection of the diode parameters D (thickness of the doped semiconductor layer), $N_d$ (doping density of the doped semiconductor layer) and A (cross-sectional area of the doped semiconductor layer at the Schottky contact).

The detector can be described to a first approximation as a capacitance $C_j$ (which is a function of the voltage across the diode) and a non-linear diode resistance $R_j$ connected in parallel thereto together with a serial resistance $R_s$ connected in series to the diode. Accordingly, the diode capacitance $C_j$ is given to an approximation by the equation $$C_j = \epsilon \epsilon_0 A / D_{depl} \tag{3}$$

wherein $\epsilon$ is the dielectric constant of the epitaxial layer and $\epsilon_0$ the dielectric field constant, i.e. the permittivity of a vacuum.

The critical frequency $v_{co}$ (cut-off frequency) of the detector is then given by $$v_{co} = (2 \pi R_s C_j)^{-1} \tag{4}$$

Increasing the cut-off frequency increases the separation of the frequency of the reference source and of the signal and thus improves the general noise properties of the detector.

In the prior art, the equation $C_j = \epsilon \epsilon_0 A / D_{depl}$ was understood to teach that in order to provide a low noise detector, the area A of the Schottky contact should be as small as possible and that the depths $D_{depl}$ of the depletion region should be as large as possible.

For this reason it was attempted to improve detector properties by reducing the contact area A, by lowering the doping density $N_d$ and by increasing the thickness of the epitaxial layer D. However, extensive and time consuming experimental investigations showed that improvements in the detectors of the prior art were no longer achievable in a controlled manner. In particular, it was unclear how the parameters of the detector A, D, $N_d$ which can be selected prior to production of the diode should be selected such that when, after production of the diode, the experimental optimization via establishment of the optimum current could result in a detector with an overall improved internal noise. It was also clear that no further optimization of the detectors was possible using equation (3).

Furthermore, it was established that by cooling generic diodes from for example 300K to 20K no significant improvement in the noise properties resulted. This stood in contrast to otherwise usual experience in the microwave, far infrared and infrared regions where such a cooling produces an improvement of at least a factor 2 to 4. Due to the very high current densities of approximately one million amperes per square centimeter ($10^6 A/cm^2$) through the Schottky contact area it would indeed have been expected that cooling the detector would have produced a substantially larger improvement in the noise.

From the above comments it is apparent that in the prior art it was unclear what was holding up the further development of the generic detectors being studied.

SUMMARY OF THE INVENTION

It is the object of the invention to provide an optoelectronic device of the initially named kind, in particular a heterodyne radiation detector, which is of particularly low noise, which makes possible fast switching and response times at high current densities and which, in particular, displays these properties also at room temperature.

It is a further object of the invention to provide a spectrometric system in the frequency range between 3 GHz and 3 THz which is particularly low in noise and in particular has the necessary sensitivity to detect very weak radiation, for example radiation with a power of less than $10^{-14}$ watts.

The object of the invention is satisfied by an optoelectronic device with a conduction constriction for current flow, the conduction constriction having a constriction cross-sectional area A of less than approximately 2 µm² and being made of a doped semiconductor layer of carrier mobility µ and of layer thickness D, the conduction constriction having an input side and an output side and being contacted on the input side from a metallically conducting input side element and on the output side by a metallically conducting output side element, wherein, in operation, the optoelectronic device is illuminated from a source of coherent radiation and wherein the thickness D of the doped semiconductor layer is larger than approximately one-half and smaller than approximately one-and-a-half times a characteristic path length $D_{mes}$, i.e.

$$D_{mes}*0.5<D<D_{mes}*1.5$$

where $D^2$ is defined by the flux quantum (h/2e) multiplied by the carrier mobility µ, i.e.

$$D^2_{mes}=(h/2e)*\mu$$

where h is Planck's constant and e elementary charge.

The object of the invention is further satisfied by the use of an optoelectronic device in accordance with the invention as a heterodyne detector and also two different uses as an AC current source.

The use as a heterodyne detector is characterized in that, on the input side, a light signal to be measured illuminates the optoelectronic device and cooperates with the source of coherent radiation in order to produce an electronic mixer signal on the output side of the optoelectronic device.

The first use as an AC current source is characterized in that light of a pre-specified frequency from the source of coherent radiation illuminates the optoelectronic device on the input side in order to produce on the output side an AC current of a frequency equal to said pre-specified frequency from the source of coherent radiation.

The second use as an AC current source is characterized in that light of a pre-specified frequency from the source of coherent radiation together with further light of a different pre-specified frequency from a further source of radiation illuminates the optoelectronic device on the input side in order to produce on the output side by means of a mixing process an AC current having an intermediate frequency equal to said pre-specified frequency minus said different pre-specified frequency.

The object of the invention is also satisfied by a spectrometric system for detecting radiation in a frequency range lying between 3 gigahertz and 3 terahertz, comprising an optoelectronic device with a conduction constriction for current flow, the conduction constriction having a constriction cross-sectional area A of less than approximately 2 µm² and being made of a doped semiconductor layer of carrier mobility µ and of layer thickness D, the conduction constriction having an input side and an output side and being contacted on the input side from a metallically conducting input side element and on the output side by a metallically conducting output side element, wherein, in operation, the optoelectronic device is illuminated from a source of coherent radiation and wherein the thickness D of the doped semiconductor layer is larger than approximately one-half and smaller than approximately one-and-a-half times a characteristic path length $D_{mes}$, i.e.

$$D_{mes}*0.5<D<D_{mes}*1.5$$

where $D^2_{mes}$ is defined by the flux quantum (h/2e) multiplied by the carrier mobility µ, i.e.

$$D^2_{mes}=(h/2e)*\mu$$

where h is Planck's constant and e elementary charge, wherein, in operation, a light signal to be measured illuminates the optoelectronic device on the input side and cooperates with the source of coherent radiation in order to produce on the output side an electronic mixer signal containing frequency components of the light signal to be measured, with the spectrometric system further comprising a frequency-matched transformer, an amplifier and a spectrometer, and wherein the mixer signal is fed via the frequency-matched transformer to the amplifier which then delivers the mixer signal to the spectrometer which determines the intensities or amplitudes of the frequency components.

The solution set forth in the claims teaches that in an optoelectronic device of the generic kind, the optimum low-noise packet-wise and ballistic carrier transport through the conduction constriction exactly pertains when the thickness of doped semiconductor layer is matched to the path length $D_{mes}$ defined above (n.b. 'mes' stands for mesoscopic).

The solution set forth in the claims is based on the observation established from a large number of investigations that in all the diodes investigated in the prior art, the square of the depth $D_{depl}$ of the depletion region existing at optimized measurement current flow under illumination with the reference radiation source calculated in accordance with equation (2) is proportional to the mobility µ of the carriers in the doped semiconductor layer.

The mobility µ of the carriers is a materials parameter of the doped semiconductor layer which is influenced for example by the doping density $N_d$ and by the temperature.

Surprisingly, it was established that the experimentally determined proportionality factor between $D_{depl}$ and the charge carrier mobility μ is very close to the value $(h/2e) = 2.0678 * 10^{-15}$ Vs. This is the value of the magnetic flux quantum which is known from the physics of superconductors.

A length $D_{mes}$ is thus defined by the equation $$D^2_{mes} := (h/2e)*\mu \tag{5}$$

which is determined alone from the quantum mechanical value (h/2e) and the classical value μ characteristic of the drift velocity for ohmic transport. This means that for all detectors which are driven under illumination at optimum current $I^{Opt}$ a depth $D_{depl}$ of the depletion region always exists which approximately corresponds to the length $D_{mes}$.

Equation (5) allows for the first time the depth of the depletion region prevailing at optimum current in noise-optimized operation to be predicted. With equation (2) it is possible for the first time to predict the parameter $N_e^{Opt}$ in terms of known detector parameters, namely $N_d$ and A, and with equation (1) it is possible for the first time to predict the parameter $I_{Opt}$.

The solution given in the claims can be physically understood to mean that only the depleted region of the doped semiconductor layer (epitaxial layer) pertaining at $I_{Opt}$ is involved in the current transfer through the conduction constriction so that the remaining regions of the doped semiconductor layer should then be superfluous and merely appear as undesired sources of layer should be matched to the length $D_{mes}$ in noise.

Consequently, the thickness of the doped semiconductor accordance with equation (5) so that the layer thickness D at least approximately matches the depth of the depletion region prevailing during operation.

The first diode (1T14) produced in accordance with the teaching of the claims immediately showed in the first measurements a two to three times improvement in the sensitivity over the prior art diode (1I12) with the hitherto best sensitivity. Considering the prevailing opinion in the prior art, it is remarkable that these improvements in the sensitivity were obtained since the inventive diode (1T14) has twice the capacitance of the best prior art diode (1I12) due to its reduced epitaxial thickness D, its larger doping density $N_d$ and its larger contact surface A.

The relationships given above were explained in terms of the example of heterodyne radiation detector diodes for the sake of a simpler understanding and due to the comprehensive prior art in this area. These relationships are, however, not restricted to this special case, but rather are valid in the form claimed for all optoelectronic devices of the generic kind. For example, alongside their use as radiation detectors, devices of the invention can also be used for example as frequency generators or AC current sources for converting an incoming optical signal into an electrical signal.

The key effect on which the diverse applications of a device of this kind are based, is the ability to transport a prespecified number of charge carriers packet-wise through the conduction constriction at a frequency determined by the reference source so that, as a result of the conservation of quantum phase coherence, the illumination of the device with a photon flux (i.e. light) produces an electron flux (i.e. current) which has the same frequency as the photon flux and also an exactly defined amplitude. Devices in accordance with the invention can thus be viewed as a kind of optical to electrical i.e. optoelectronic converter.

Three aspects of the above effect are particularly noteworthy. First, the effect operates at room temperature and, for example, at 50° C. just as well as it does at cryogenic temperatures of for example 20K. Second, the efficiency (often termed as quantum efficiency) of the conversion of photons into electrons (or holes) is extremely high. Third, as a result of the equation (5) of the invention it is possible for the first time to reduce the noise of a device exploiting this effect to a low level previously not possible.

It should be emphasised that the fact that the carrier mobility μ of the doped semiconductor layer is an important design parameter for devices of the generic kind was not previously appreciated and is only realised for the first time in the present invention with the teaching set forth in the claims.

In contrast, for prior art diodes, the mobility μ was not used when designing diodes since it was assumed that the design and dimensioning of diodes should be made in accordance with equation (3) and that the optimum current could only be established by a calibration process performed for each individual diode after its manufacture.

For small cross-sectional areas A in particular edge effects become increasingly important for the form the depletion region. These edge effects result in the actual depths of the depletion region being smaller than the depletion region depths $D_{depl}$ calculated from equation (2) which does not take edge effects into one times the characteristic path length $D_{mes}$.

The doped semiconductor layer is preferably made from a III-V semiconductor, in particular GaAs, InP, InAs or GaSb or a III-V compound, in particular GaInAs, GaAlAs, GaInP, GaInSb or GaInAsP. Silicon, Germanium or their compounds can also be used.

For use of the device as a radiation detector in particular it has proved to be advantageous when the input side element is constructed as an antenna to aid the coupling in of the reference radiation and of the radiation to be measured.

The antenna can be made from a whisker of metal, in particular of gold-nickel (Au—Ni) alloy.

The Schottky contact is preferably manufactured from a platinum-gold (Pt—Au) alloy.

A further advantageous embodiment of the invention is characterised in that the doped semiconductor layer is provided with a capping layer having an opening through which the input side element contacts the doped semiconductor layer. This results in a particularly stable diode configuration.

In most practical implementations, the capping layer comprises a plurality of openings. This makes the contacting process during manufacture easier since it is not necessary to find any particular opening. Moreover, it is also possible to contact a plurality of antennae alongside one another onto the doped semiconductor layer.

The capping layer can for example be made of silicon dioxide ($SiO_2$) or of silicon nitride ($Si_3N_4$).

Through the use of a frequency stabilised far infrared ring laser as the reference source, the sensitivity achievable with a detector of the invention is favourably influenced since such a laser delivers the desired frequency stability and amplitude stability as well as the necessary power.

Further advantageous embodiments of the present invention are given in the subordinate claims.

BRIEF DESCRIPTION OF THE DRAWINGS

The invention is described in the following with the aid of the drawing; this shows.

DETAILED DESCRIPTION

Figure 1:
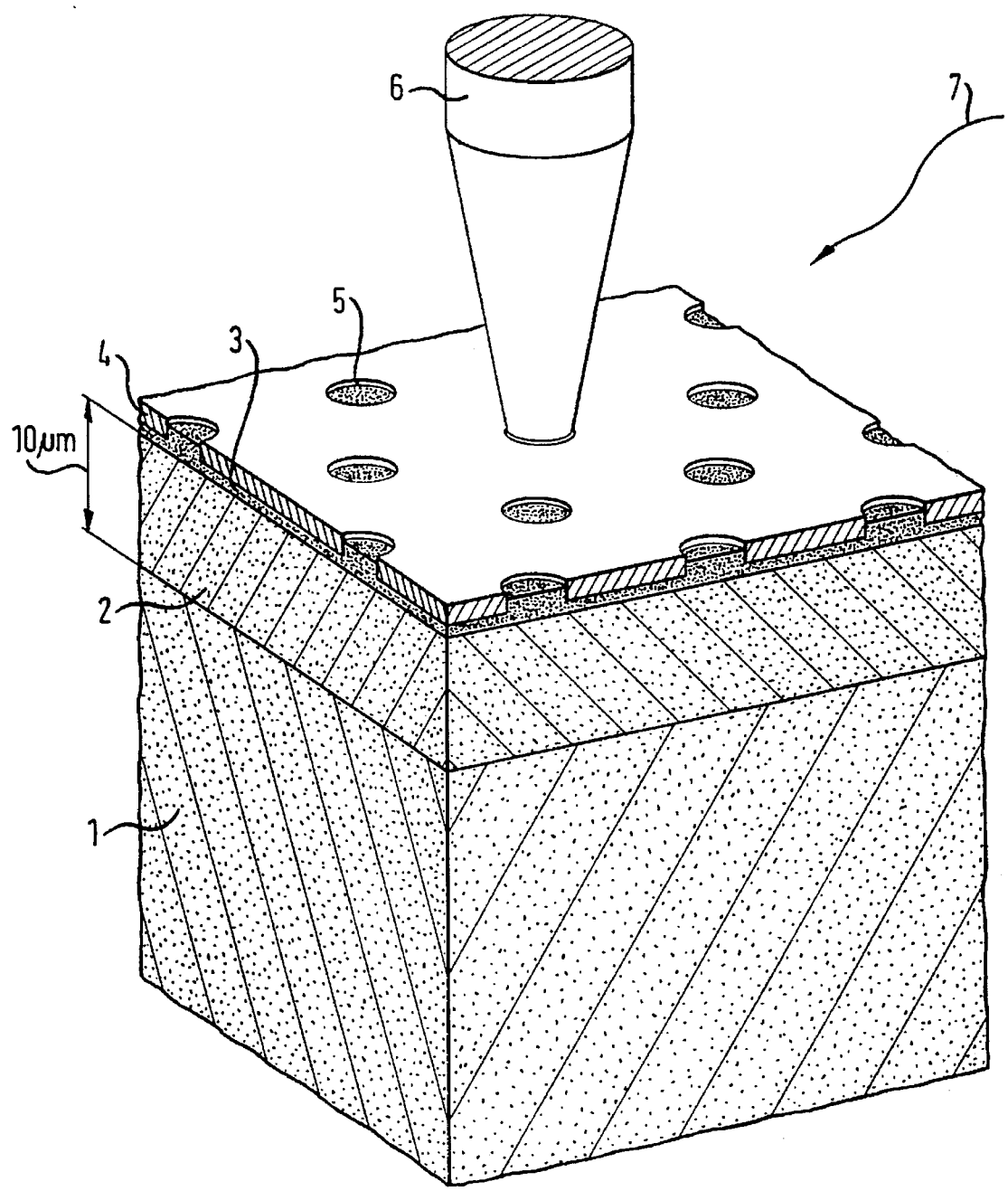
FIG. 1 a schematic illustration of a first embodiment of the invention as a detector diode, FIG. 2 a cross-sectional view of the detector diode of FIG. 1 with an equivalence circuit drawn into it, FIG. 3 a parameter table of the detector diodes J118, 1I7 and 1I12 of the prior art and of the detector diodes 1T14 and 1T15 of the invention, FIG. 4 an illustration of the system noise temperature $T_{Sys}$ of the detector diodes 1T14 and 1T15 of the invention as a function of the reference source frequency, FIG. 5 an illustration of a spectrometric system in accordance with the invention in which a detector diode in accordance with the invention is used, FIG. 6 a diagram of the $D^2_{depl}$ versus μ behaviour of the diodes 1I12, 1I7 and J118 of the prior art and diode 1T15 of the invention, FIG. 7 diagram showing the voltage $V_0$ across the depletion region versus the normalised current $I^{Opt}/N_e^{Opt}$ for the diodes 1T15, J118, 1I7 and 1I12, and FIG. 8A and 8B schematic illustration of two further embodiments of an optoelectronic device in accordance with the invention.

FIG. 1 schematically shows the structure of the detector diodes 1T14 and 1T15 of the invention. This structure differs from the prior art diodes J118, 1I7 and 1I12 through the choice of the thickness of the epitaxial layer 3. The values given in the following relate to the diode 1T14 of the invention.

The diode structure is produced with molecular beam epitaxy (MBE) and is made up of a highly doped, metallically conducting n⁺-GaAs substrate 1 on whose surface a corresponding n⁺-GaAs buffer layer 2 of thickness 1 μm is grown. An n-GaAs epitaxial layer 3 with doping density $N_d=10^{18}$ cm⁻³ and layer thickness D=30 nm is then grown on top of the buffer layer 2 as the doped semiconductor layer. The epitaxial layer 3 is coated by a $SiO_2$ capping layer 4 of thickness 170 nm which is provided with a plurality of contacting holes 5. The epitaxial layer 3 is contacted by a metallic whisker 6 through one of these contact holes 5 and represents the input side element forming the Schottky contact and also serves as an antenna for the radiation signal which is to be measured as well as for the reference source signal indicated by the reference numeral 7. The contact diameter d of the Schottky contact formed between the tip of the whisker and the epitaxial layer 3 amounts to approximately 0.5 μm.

Figure 2:
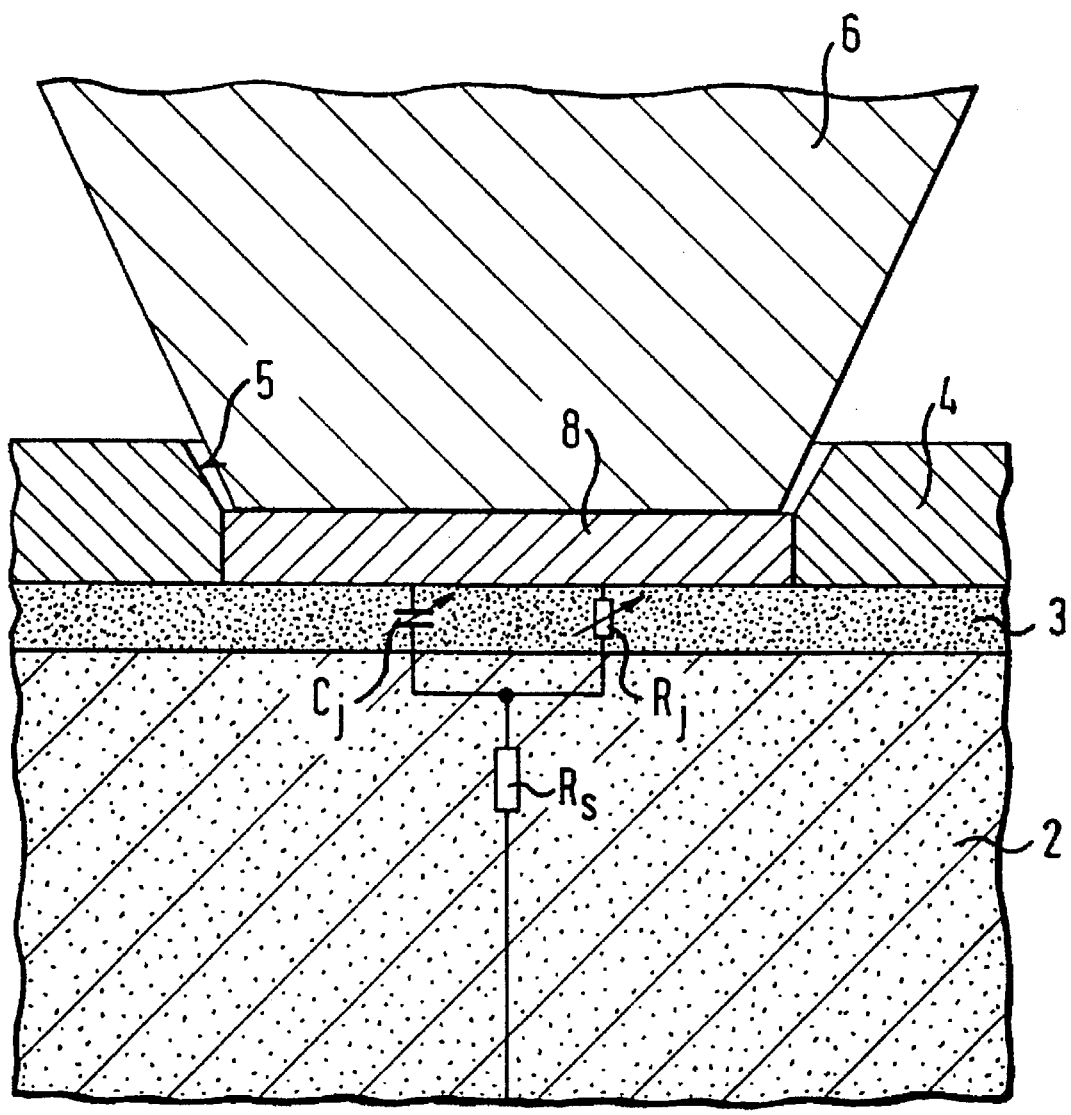

FIG. 2 shows a cross-sectional view of the diode illustrated in FIG. 1, with the same parts labelled with the same reference numerals as in FIG. 1.

The separate anode region 8 of the whisker 6 which contacts the epitaxial layer 3 is produced via a weld-like contacting process during manufacture of the diode as will be described further below.

From the equivalence circuit diagram drawn into FIG. 2 it can be seen that the diode can be regarded approximately as a capacitor $C_j$ with a resistance $R_j$ connected in parallel thereto together with a serial resistance $R_s$. $C_j$ and $R_j$ represent the capacitance and resistance respectively of the epitaxial layer 3 with the Schottky contact. The serial resistance $R_s$ represents the total resistance of the substrate 1 and buffer layer 2.

FIG. 3 shows a table in which the detector data of the known diodes J118, 1I7, 1I12 and the diodes 1T14 and 1T15 of the invention are given. It can be seen from the table that only in the diodes 1T14 and 1T15 of the invention is the thickness of the epitaxial layer matched to the thickness of the depletion region occurring in operation in accordance with the relationship given in claim 1.

As already mentioned, the diode 1T14 of the invention already demonstrated an approximately 2 to 3 times better sensitivity than the best prior art diode 1I12 even though the diode 1T14 has a capacitance which is almost double that of the diode 1I12 and also a larger anode area A.

In the above, the depletion region has always been considered without edge effects so that its depths is determined from equation (2). However, in particular for smaller cross-sectional areas of the contact, it is advantageous to take the influence of edge effects into account.

This can be performed for example for circular contact surfaces with a diameter d (or radius R) by approximating the depletion region at the edge of the contact surface as a quadrant-shaped arc. The active depletion region thickness is then given by $$N_e = R^2 \pi D_{depl} N_d + 0.5 \pi^2 R D_{depl}^2 N_d \qquad (6)$$

The depth of the depletion region calculated according to this equation is given in the table alongside the values calculated from equation (2) for the different diodes. It can be seen that a 10 to 20 percent difference exists between the corresponding values and that the relative difference becomes larger as the anode diameter reduces.

For the diode 1T15 with the smallest diameter of 0.25 μm the corresponding values are already approximately 20% different from one another, whereas for the diode J118 with a diameter of 1.0 μm they are only 10% different.

From the above formulae it follows that the simple disc approximation of equation (2) (without taking edge effects into account) is adequate for diodes with an anode diameter of 0.5 μm, but that for anode diameters of less than 0.25 μm the edge effects should be taken into account as set forth in equation (6) if optimum signal-to-noise behaviour is to be achieved.

Figure 4:
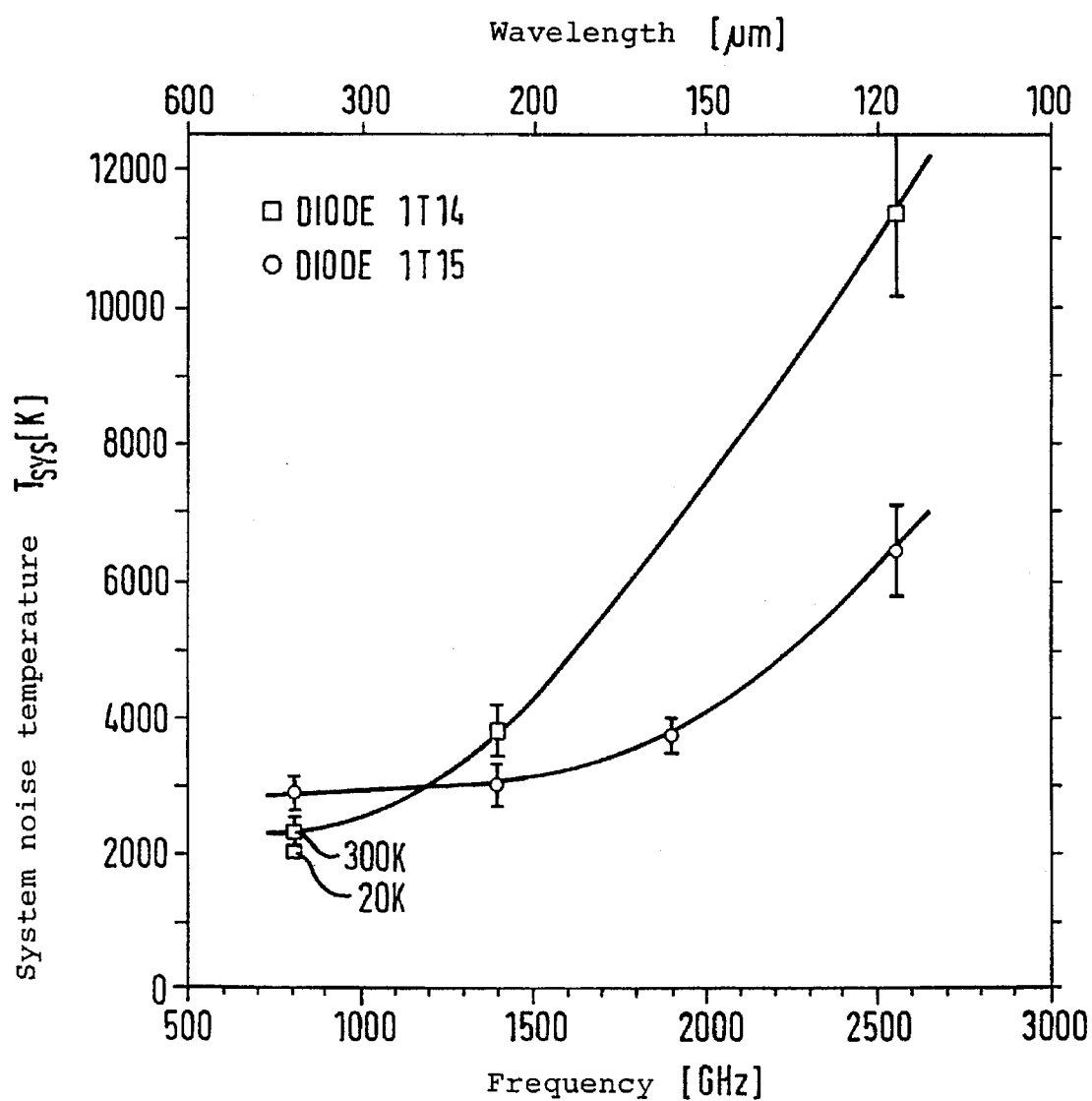

A comparison of the frequency dependent noise behaviour of the two diodes 1T14 and 1T15 of the invention is shown in FIG. 4.

The sensitivity of the entire system of diode and subsequently connected amplifier and spectrometer is shown in FIG. 4 in terms of the system noise temperature $T_{sys}$, $T_{sys}$ being the ratio of measured noise level to signal level, this being dominated by the internal noise of the particular diode. The system noise temperature $T_{sys}$ is proportional to the so-called noise equivalent power according to the relationship $$NEP = kT_{sys} \qquad (7)$$

k being Boltzmann's constant.

FIG. 4 shows first of all that the sensitivity of both diodes 1T14 and 1T15 of the invention are better than the sensitivity of all prior art diodes examined over the entire frequency range. It is noted that this data is published in H. P. Röser, Infrared Physics, volume 32, page 385 (1991).

At 800 GHz the diode 1T15 is somewhat less sensitive than the diode 1T14. On the other hand, at approximately 2500 GHz the diode 1T15 is more sensitive than diode 1T14 by approximately a factor of 2. This shows that in particular at higher frequencies the smaller anode capacitance of approximately 0.25 fF of diode 1T15 is preferred over the approximately four times larger anode capacitance of diode 1T14.

The temperature dependence of the diodes of the invention is relatively small as a result of the ballistic carrier transport processes. Cooling the diode 1T14 from 300K to 20K improves the sensitivity of diode only by 30%.

The diode 1T14 achieves a sensitivity at 800 GHz which only lies fifty-two times above the quantum noise. This means that a signal radiation of 52 photons per second is still just measurable. At 2547 GHz the detection threshold of this diode is 69 times above the quantum noise. The quantum efficiency of the diode 1T15 amounts to 66 at 803 GHz and 33 at 2547 GHz.

Consequently, radiation energies in the region of $10^{-14}$ W are detectable without difficulty and, to emphasise it once again, without having to cool the detector.

The manufacture of diodes is performed under a light microscope. The whisker tip is guided into one of the contact holes 5 and welded onto the epitaxial layer 3 by applying a short current pulse.

When doing this, the pressure exerted by the whisker tip onto the epitaxial layer 3 prior to the welding or interdiffusion process is important for achieving maximum sensitivity. For diode 1T14 it was established that optimum sensitivity is achieved with a contact pressure of $1.25 * 10^5$ N/cm$^2$.

Figure 5:
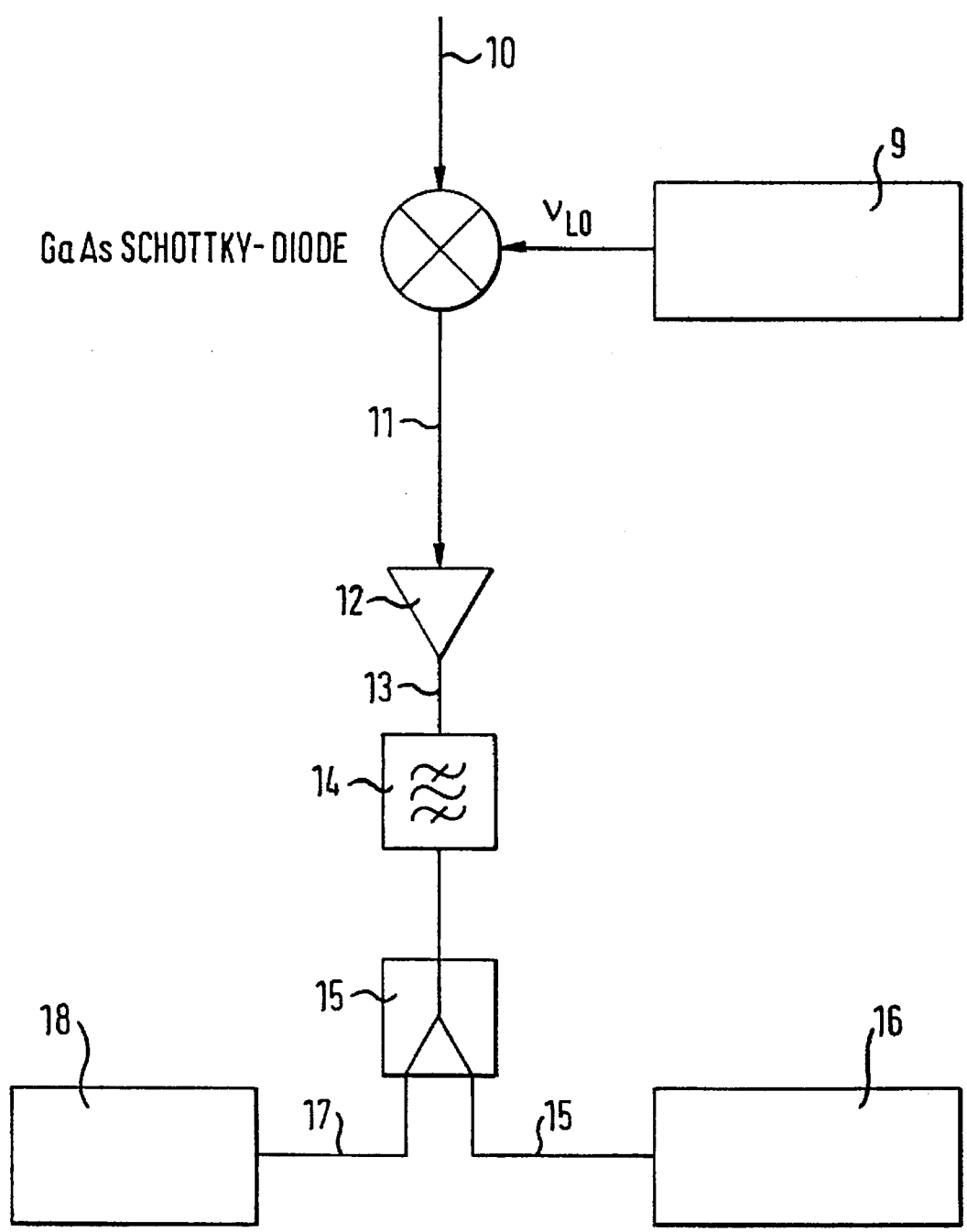

FIG. 5 shows the construction of a spectrometric system which includes a GaAs detector diode in accordance with the invention. An optically pumped frequency stabilised ring laser 9 is used as the reference radiation source here, for example with a frequency of 1397 GHz. This laser delivers sufficient power ($P_{LO} \geq 50$ mW), a good power stability ($\Delta P \ll 1\%$ in amplitude) and a good frequency stability ($\Delta v \ll 1$ kHz).

The signal 10 to be detected by the diode has in this example a frequency of 1382 GHz.

The difference signal produced by the diode in mixing operation then has a difference frequency of $vm_{IF}=15$ GHz and is fed into a low noise HEMT=amplifier 12 for the purpose of amplification (HEMT=high electron mobility transistor). An optimized impedance transformer 19 can be incorporated between the diode and the input of the HEMT 12 in order to keep matching losses as small as possible.

The signal 13 output by the HEMT amplifier 12 passes through a filter 14 of bandwidth of $\Delta v_{BW}=1400$ MHz and is supplied via a signal line 15 to an acousto-optical spectrometer (AOS) 16. The acousto-optical spectrometer 16 divides up the incoming signal 15 simultaneously into, for example, 2048 frequency channels and thus allows a resolution of approximately 700 kHz per channel or alternatively $\Delta v/v \approx 5*10^{-7}$. In other words, the system has a quality factor Q of approximately $2*106$ and is thus capable of resolving photons with an energy difference of $3*10^{-9}$ eV at a frequency of 1382 gigahertz (6 meV).

The signal output from the filter 14 can additionally be supplied to a wide bandwidth detector 18 via a second signal line 17.

Figure 6:
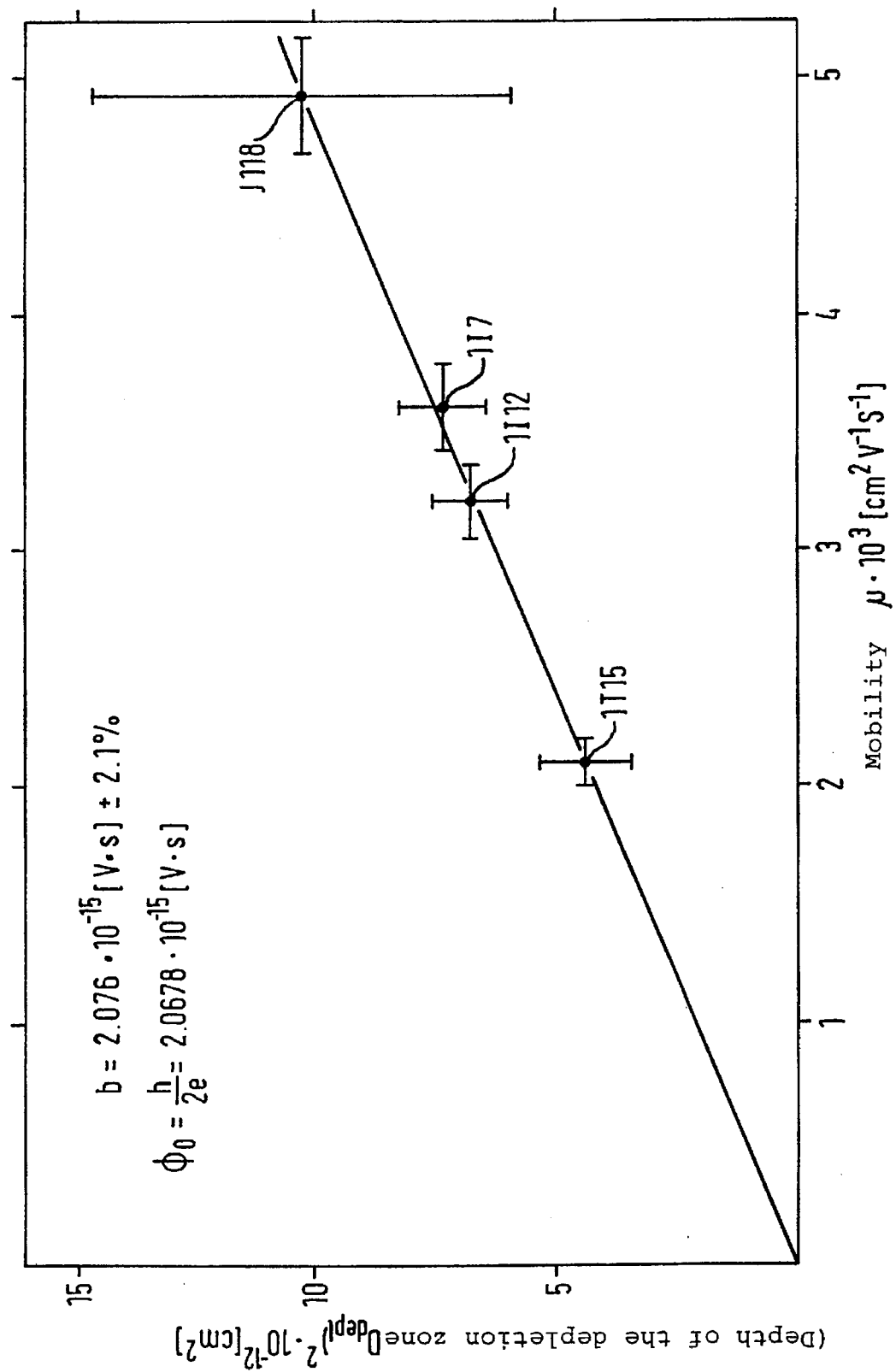

The surprising proportionality between $D^2_{depl}$ and $\mu$ established in the course of the investigations leading to the present invention has already been mentioned and is illustrated in FIG. 6. This relationship is not only fulfilled by the diode 1T15 of the invention, but also by the prior art diodes I112, I17 and J118 despite the fact that the individual diodes have very different detector parameters D, A and $N_d$. The proportionality factor is a fundamental physical quantity, namely the magnetic flux quantum (h/2e).

FIG. 7 shows a diagram in which the voltage $V_0$ applied across the depletion region of depths $D_{depl}$ is shown versus the normalised current flow $I^{Opt}/N_e^{Opt}$ for all the diodes investigated and for all frequencies measured. All the diodes investigated also show the same behaviour here and yield an experimentally determined proportionality factor with a value $R_e=25.250$ Ohm which, within experimental error, agrees with the quantum Hall resistance $R_H=(h/e^2)$ which is also a fundamental physical constant, albeit one which has hitherto only been observed in connection with low temperature measurements, for example at four Kelvin or below.

The behaviour illustrated in FIG. 7 shows that when the optimum current $I^{Opt}$ flows, the conduction constriction has a resistance of $R_H/N_e^{Opt}$ regardless of the individual values of the parameters A, D, and $\mu$ which the diode possesses.

The results shown in FIG. 6 and FIG. 7 are not only valid for the special case of Schottky diodes, for which they were verified first of all, but rather quite generally for all optoelectronic devices falling within the scope of the claims. The claims thus deliver a teaching for optimizing the internal noise of all optoelectronic devices of this kind.

In electronics, oscillators with ever higher frequencies are desired, for example as clocks for computers and other digital circuits. Up to now, the maximum frequency achievable is around 100 GHz. As can be seen from FIG. 4, devices in accordance with the invention are capable of delivering AC currents with frequencies orders of magnitude higher than 100 GHz. Devices in accordance with the invention could in particular find application in microelectronics in the frequency range between 100 GHz and 500 GHz for which the production of other circuit elements is feasible or will become feasible in the forseeable future.

FIGS. 8A and 8B each show an example of an optoelectronic device which does not comprise a Schottky diode and which can, for example, be employed as a high frequency oscillator of this kind.

An oscillator of this kind is extremely stable in its power since the oscillator current only depends on $N_e^{Opt}$ and on the frequency of the reference radiation. Moreover, the oscillator is extremely frequency stable since the frequency is directly fixed by the frequency of the source of reference radiation which, in turn, can be held very stable, i.e. with high Q values.

The device 20 based on a n$^+$-GaAs substrate 21 onto which an epitaxial metallically conducting n$^+$-GaAs buffer layer 22, an n-GaAs epitaxial layer 23 of thickness D and a metallically conducting p$^+$-GaAs layer 24 are deposited. This original layer build-up is indicated in FIG. 8A by the dashed lines.

The n-GaAs epitaxial layer 23 can for example have a charge carrier mobility $\mu=3000$ cm$^2$/(Vs). The layers 22, 23 and 24 can be etched away to form a pillar 25 with a predeterminable cross-sectional area A in a controlled manner via reactive ion etching which is a process known in semiconductor technology. The pillar 25 retains the original layer sequence 22, 23, 24 of the semiconductor material indicated by the layers 22a, 23a, 24a.

The device 20 achieved in this manner can be electrically contacted at the upper end 26 of the pillar and at the metallically conducting n$^+$-GaAs substrate 21 and, in operation, is illuminated with a reference radiation 7.

This effects that, independent of the intensity of the reference radiation 7, a constant number of electrons per period pass from the substrate-side layer zone 22a through the epitaxial layer zone 23a into the layer zone 24a of the pillar 25 remote from the substrate.

Consequently, an electrical signal corresponding to the reference radiation 7 is provided across the contacts 26, 27. The device 20 thus operates as an optoelectronic converter in the manner of the invention.

Corresponding to the above explanations, the device 20 operates in a particularly low-noise manner when the thickness D of the epitaxial layer zone 23a in the pillar 25 which forms the conduction constriction is so chosen that an optimum packet-wise and ballistic transport of electrons takes place through the conduction constriction. In order to achieve this, the layer 23 can have, for example, a thickness of D=24.9 nanometers.

FIG. 8B shows a further embodiment of an optoelectronic device 20' in accordance with the invention which is constructed from a metallically conducting $n^+$-GaAs substrate 21', a $n^+$-GaAs buffer layer 22' thereabove, a n-GaAs layer 23' of charge carrier mobility μ and a metallically conducting $n^+$-GaAlAs layer 24'.

The layer structure 22', 23', 24' is, as in the example of FIG. 8A, removed by reactive ion etching down to a pillar 25' having a layer sequence 23a' and 24a' corresponding to that of the original layer 23' and 24'. Since, by use of appropriate etchants, GaAlAs and GaAs have different etching properties, it can be achieved via selective etching that the n-GaAs layer zone 23a' of the pillar 25' has a cross-sectional area A which is reduced in relation to the other parts of the pillar 25'.

The device 20' can be electrically contacted at the upper end 26' of the pillar and also at 27' to the metallically conducting $n^+$-GaAs substrate 21' and, in operation, is illuminated at least in the region of the pillar 25' with a reference radiation 7.

The mode of operation of the device 20' as an optoelectronic converter corresponds to the mode of operation of the device 20 shown in FIG. 8A with an analogous design of the constriction parameters D and μ.

I claim:

1. Optoelectronic device with a conduction constriction for current flow, the conduction constriction having a constriction cross-sectional area A of less than approximately 2 μm² and being made of a doped semiconductor layer of carrier mobility μ and of layer thickness D, the conduction constriction having an input side and an output side and being contacted on the input side from a metallically conducting input side element and on the output side by a metallically conducting output side element, wherein, in operation, the optoelectronic device is illuminated from a source of coherent radiation and wherein the thickness D of the doped semiconductor layer is larger than approximately one-half and smaller than approximately one-and-a-half times a characteristic path length $D_{mes}$, i.e.

$$D_{mes}*0.5 < D < D_{mes}*1.5$$

where $D^2_{mes}$ is defined by the flux quantum (h/2e) multiplied by the carrier mobility μ, i.e.

$$D^2_{mes} = (h/2e)*\mu$$

where h is Planck's constant and e elementary charge.

2. Optoelectronic device in accordance with claim 1, wherein the input side element cooperates with an antenna for coupling in the coherent radiation as well as further radiation to be measured.

3. Optoelectronic device in accordance with claim 1, wherein a Schottky contact is provided between the input side element and the doped semiconductor layer.

4. Optoelectronic device in accordance with claim 2, wherein a Schottky contact is provided between the input side element and the doped semiconductor layer.

5. Optoelectronic device in accordance with claim 1, wherein the thickness D of the doped semiconductor layer is between 0.75 and 1.25 times the characteristic path length $D_{mes}$.

6. Optoelectronic device in accordance with claim 1, wherein the thickness D of the doped semiconductor layer is between 0.5 and 1.0 times the characteristic path length $D_{mes}$.

7. Optoelectronic device in accordance with claim 1, wherein the constriction cross-sectional area A is less than 0.2 μm².

8. Optoelectronic device in accordance with claim 1, wherein the constriction cross-sectional area A is less 0.05 μm².

9. Optoelectronic device in accordance with claim 1, wherein the constriction cross-sectional area A has a substantially circular form.

10. Optoelectronic device in accordance with claim 1, wherein the thickness D of the doped semiconductor layer is between 15 and 40 nanometers.

11. Optoelectronic device in accordance with claim 1, wherein the thickness D of the doped semiconductor layer is between 20 and 35 nanometers.

12. Optoelectronic device in accordance with claim 1, wherein the doped semiconductor layer has a doping concentration $N_d$ of between $5*10^{16}$ and $2*10^{18}$ cm$^{-3}$.

13. Optoelectronic device in accordance with claim 1, wherein the doped semiconductor layer has a doping concentration $N_d$ of between $4*10^{17}$ and $1.1*10^{18}$ cm$^{-3}$.

14. Optoelectronic device in accordance with claim 1, wherein the doped semiconductor layer is n-type.

15. Optoelectronic device in accordance with claim 1, wherein the output side element is made of an $n^+$-semiconductor.

16. Optoelectronic device in accordance with claim 1, wherein the input side element is made of a gold-nickel (Au—Ni) alloy.

17. Optoelectronic device in accordance with claim 1, wherein the input side element is made of a $p^+$-semiconductor.

18. Optoelectric device in accordance with claim 1, wherein the doped semiconductor layer is made of a III-V semiconductor.

19. Optoelectronic device in accordance with claim 1, wherein, adjacent the input side element, the doped semiconductor layer is provided with a capping layer having an opening through which the input side element contacts the doped semiconductor layer.

20. Optoelectronic device in accordance with claim 1, wherein the capping layer is made of silicon dioxide ($SiO_2$) or of silicon nitride ($Si_3N_4$).

21. Optoelectronic device in accordance with claim 2, wherein the antenna is made of a whisker out of metal, in particular out of a gold-nickel (Au—Ni) alloy.

22. Optoelectronic device in accordance with claim 3, wherein the Schottky contact is realised by soldering with a platinum-gold (Pt—Au) alloy.

23. Optoelectronic device in accordance with claim 1, wherein the source of coherent radiation produces radiation with a frequency lying between 3 gigahertz and 3 terahertz.

24. Optoelectronic device in accordance with claim 1, wherein the source of coherent radiation is a far infrared ring laser.

25. Optoelectronic device in accordance with claim 24, wherein the far infrared ring laser has a frequency stability Q exceeding one part in one million.

26. Optoelectronic device in accordance with claim 1, wherein the source of coherent radiation is a microwave source.

27. Optoelectronic device in accordance with claim 1, wherein the doped semiconductor layer is contacted on the input side by a plurality of antennae.

28. Optoelectronic device in accordance with claim 1, wherein the output side element is a metallically conducting epitaxial buffer layer on top of a metallically conducting semiconductor substrate.

29. Optoelectronic device in accordance with claim 28, wherein the metallically conducting buffer layer and the metallically conducting semiconductor substrate are made of $n^+$-semiconductor, in particular $n^+$-GaAs.

30. Use of an optoelectronic device in accordance with claim 1 as a heterodyne detector, wherein, on the input side, a light signal to be measured illuminates the optoelectronic device and cooperates with the source of coherent radiation in order to produce an electronic mixer signal on the output side of the optoelectronic device.

31. Use of an optoelectronic device in accordance with claim 1 as an AC current source, wherein light of a pre-specified frequency from the source of coherent radiation illuminates the optoelectronic device on the input side in order to produce on the output side an AC current of a frequency equal to said pre-specified frequency from the source of coherent radiation.

32. Use of an optoelectronic device in accordance with claim 1 as an AC current source, wherein light of a pre-specified frequency from the source of coherent radiation together with further light of a different pre-specified frequency from a further source of radiation illuminates the optoelectronic device on the input side in order to produce on the output side by means of a mixing process an AC current having an intermediate frequency equal to said pre-specified frequency minus said different pre-specified frequency.

33. Spectrometric system for detecting radiation in a frequency range lying between 3 gigahertz and 3 terahertz, comprising an optoelectronic device with a conduction constriction for current flow, the conduction constriction having a constriction cross-sectional area A of less than approximately 2 µm$^2$ and being made of a doped semiconductor layer of carrier mobility µ and of layer thickness D, the conduction constriction having an input side and an output side and being contacted on the input side from a metallically conducting input side element and on the output side by a metallically conducting output side element, wherein, in operation, the optoelectronic device is illuminated from a source of coherent radiation and wherein the thickness D of the doped semiconductor layer is larger than approximately one-half and smaller than approximately one-and-a-half times a characteristic path length $D_{mes}$, i.e., $$D_{mes}*0.5<D<D_{mes}*1.5$$

where $D^2_{mes}$ is defined by the flux quantum (h/2e) multiplied by the carrier mobility µ, i.e.

$$D^2_{mes}=(h/2e)*\mu$$

where h is Planck's constant and e elementary charge, wherein, in operation, a light signal to be measured illuminates the optoelectronic device on the input side and cooperates with the source of coherent radiation in order to produce on the output side an electronic mixer signal containing frequency components of the light signal to be measured, with the spectrometric system further comprising a frequency-matched transformer, an amplifier and a spectrometer, and wherein the mixer signal is fed via the frequency-matched transformer to the amplifier which then delivers the mixer signal to the spectrometer which determines the intensities or amplitudes of the frequency components.

34. Optoelectric device in accordance with claim 18, wherein the doped semiconductor layer is selected from the group consisting of GaAs, InP, InAs and GaSb.

35. Optoelectric device in accordance with claim 18, wherein said doped semiconductor layer is selected from the group consisting of GaInAs, GaAlAs, GaInP, GaInSb and GaInAsP.

* * * * *

UNITED STATES PATENT AND TRADEMARK OFFICE
CERTIFICATE OF CORRECTION

PATENT NO.  : 5,631,489
DATED       : May 20, 1997
INVENTOR(S) : Hans P. Roser

It is certified that error appears in the above-identified patent and that said Letters Patent is hereby corrected as shown below:

Col. 3, line 51. -   delete "$D^2$" and substitute -- $D^2_{mes}$ --

Col. 5, line 29  -   delete "layer should be matched to the length $D_{mes}$ in"

Col. 5, line 32  -   before "accordance" insert -- layer should be matched to the length $D_{mes}$ in --

Col. 6, line 25  -   after "into" insert -- account. It is therefore preferred, in particular for small contact surfaces, Col. , line     -    A that the thickness D of the doped semiconductor layer lies between one-half and --

Col. 9, line 34  -   delete "$vm_{IF}$ = 15 GHZ" and substitute -- $v_{IF}$ = 15 GHz --

Col. 9, line 48  -   delete "2*106" and substitute -- $2*10^6$ --

Signed and Sealed this

Twenty-first Day of April, 1998

Attest:

BRUCE LEHMAN

*Attesting Officer*       Commissioner of Patents and Trademarks